United States Patent
Gangemi et al.

(10) Patent No.: US 12,209,771 B1
(45) Date of Patent: Jan. 28, 2025

(54) AIR FILTRATION SYSTEM FOR DATACENTER OR OTHER BUILDING

(71) Applicant: Amazon Technologies, Inc., Seattle, WA (US)

(72) Inventors: Matthew Gangemi, Seattle, WA (US); Joseph Ephraim Melvin, Seattle, WA (US); Jenni R. Gregg, Monroe, WA (US); Richard Philip Juntunen, Bothell, WA (US)

(73) Assignee: Amazon Technologies, Inc., Seattle, WA (US)

( * ) Notice: Subject to any disclaimer, the term of this patent is extended or adjusted under 35 U.S.C. 154(b) by 418 days.

(21) Appl. No.: 17/537,190

(22) Filed: Nov. 29, 2021

(51) Int. Cl.
| | |
|---|---|
| *B01D 53/02* | (2006.01) |
| *F24F 8/90* | (2021.01) |
| *F24F 11/39* | (2018.01) |
| *F24F 11/61* | (2018.01) |
| *F24F 13/28* | (2006.01) |
| *H05K 7/20* | (2006.01) |
| *F24F 110/40* | (2018.01) |

(52) U.S. Cl.
CPC ............... *F24F 8/90* (2021.01); *F24F 11/39* (2018.01); *F24F 11/61* (2018.01); *F24F 13/28* (2013.01); *H05K 7/20745* (2013.01); *F24F 2110/40* (2018.01); *F24F 2221/225* (2013.01)

(58) Field of Classification Search
CPC .... F24F 8/90; F24F 11/39; F24F 11/61; F24F 13/28; F24F 2110/40; F24F 2221/225; H05K 7/20745
See application file for complete search history.

(56) References Cited

U.S. PATENT DOCUMENTS

| | | | | |
|---|---|---|---|---|
| 4,808,234 A | * | 2/1989 | McKay | B01D 41/04 15/345 |
| 4,826,512 A | * | 5/1989 | Fuller | B01D 46/2411 55/290 |
| 5,921,619 A | * | 7/1999 | Cederberg | B60H 1/00378 454/136 |
| 6,065,922 A | * | 5/2000 | Kato | B65G 69/186 141/93 |
| 6,117,200 A | * | 9/2000 | Berg | A47L 11/4033 55/300 |
| 10,226,786 B2 | * | 3/2019 | Flasher | B05B 14/43 |
| 10,744,443 B2 | * | 8/2020 | Silvestro | B01D 46/0005 |
| 2004/0255783 A1 | * | 12/2004 | Graham | B01D 46/10 55/528 |
| 2005/0269365 A1 | * | 12/2005 | Boroch | B65B 1/16 222/181.2 |

(Continued)

*Primary Examiner* — Christopher P Jones
(74) *Attorney, Agent, or Firm* — Kilpatrick Townsend & Stockton LLP

(57) ABSTRACT

A filtration system for a datacenter or other building can include filter media arranged in an airflow path between an inlet and an outlet each configured for air flow therethrough relative to a chamber. The chamber may be defined at least in part by walls and a floor of a room of the building, for example. The filtration system can further include a dust dislodgment system that dislodges dust accumulated in the filter media. For example, dislodged dust may be permitted to fall toward the floor. The filtration system can further include a dust collection system for collecting and/or removing dislodged dust, such as from the floor.

20 Claims, 7 Drawing Sheets

(56) References Cited

U.S. PATENT DOCUMENTS

| | | | |
|---|---|---|---|
| 2010/0123312 A1* | 5/2010 | Scott | F16L 21/03 |
| | | | 285/390 |
| 2015/0251117 A1* | 9/2015 | Madonia | F04B 53/20 |
| | | | 15/21.1 |
| 2017/0157547 A1* | 6/2017 | Payne | F24F 13/28 |
| 2017/0211440 A1* | 7/2017 | Salsgiver | F01N 3/035 |
| 2018/0093215 A1* | 4/2018 | Pindter | B01D 46/023 |
| 2019/0030476 A1* | 1/2019 | Fanning | B01D 46/0086 |
| 2019/0170377 A1* | 6/2019 | Suchansky | F24F 8/108 |

* cited by examiner

AIR FILTRATION SYSTEM FOR DATACENTER OR OTHER BUILDING

BACKGROUND

Most buildings utilize heating, ventilation, and air conditioning (HVAC) systems to provide heating or cooling to spaces within the building. For example, many commercial buildings use HVAC systems to regulate air temperature and/or humidity so that spaces within the building will be comfortable for people working, playing, or otherwise spending time in those spaces. Some HVAC systems are designed to provide specific amounts of heating and/or cooling to equipment housed in the building. For example, HVAC systems may be used to provide cooling to computer servers and associated components housed in a datacenter or comparable facility. Such HVAC systems are typically operated so as to provide air to equipment at a temperature that is suitable for providing sufficient heat transfer between the air and the equipment to maintain the equipment within a target temperature range, regardless of the temperature of the environment outside of the building.

Generally, HVAC systems have intake and/or exhaust vents for respectively communicating air from or into the environment. For example, HVAC systems usually pull air from the environment through an intake vent and pass that air into a conditioned space (often after suitably conditioning the air such as by changing levels of heat, moisture, and/or pressure) so that heat is transferred into the air (i.e., to cool things in the room) or out of the air (i.e., to heat things in the room). Air that has undergone such heat transfer is often passed out of the conditioned space and released into the environment through an exhaust vent.

Filtration may be an important aspect of conditioning between the intake vent and the exhaust vent. For example, in many arrangements, paper filters or other forms of disposable filter media may be positioned to capture dust or other particulate from air used in the building. Such disposable filters typically become loaded with dust or other particulate in use and are replaced in due course with fresh disposable filters. However, levels of dust and other particulate in environmental conditions at the intake vent may vary over time and lead to unpredictable levels of loading in disposable filters. Accordingly, substantial labor costs may be incurred for inspecting and replacing disposable filters, in addition to material costs of obtaining suitable quantities of replacement disposable filters.

BRIEF DESCRIPTION OF THE DRAWINGS

Various embodiments in accordance with the present disclosure will be described with reference to the drawings, in which.

DETAILED DESCRIPTION

Figure 1:
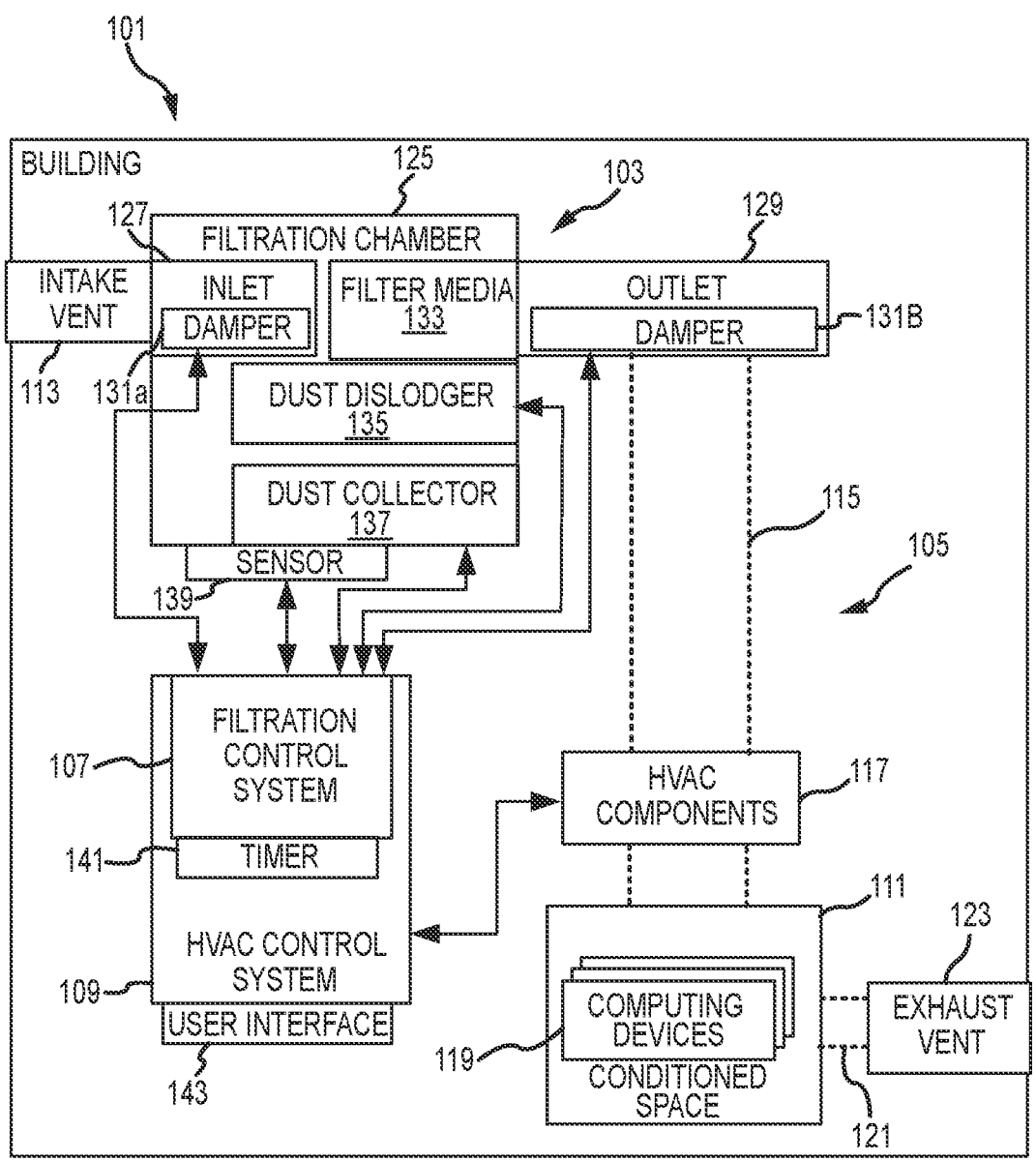
FIG. 1 illustrates a schematic view of an example of a building with a filtration system that can facilitate use of re-usable filter media according to certain embodiments.

Techniques described herein include HVAC systems having filtration systems that allow dust or other particulate in filter media to be dislodged and collected. Dislodging and collecting the dust or other particulate can allow the filter media to be re-used, for example. In various examples, the dislodged dust or other particulate may be allowed to fall to a floor of a room, where the dust or other particulate can be collected and/or removed for disposal.

In a particular example of a system in operation, air may initially flow in through an intake vent into a room or chamber, such as from an exterior environment. The air may continue through the room or chamber and pass through filter media before exiting through an outlet that may supply an HVAC system, for example. Prior to passage through the filter media, the air may contain dust or other particulate. (For simplicity, although discussion below mainly refers to dust, it should be understood that dust and particulate may be used interchangeably, e.g., such that any reference to dust may be equally applicable to other forms of airborne particulate and vice versa). Passage of the air through the filter media may extract the dust from the air and catch the dust within the filter media. As the filter media becomes loaded with dust, a pressure drop between upstream and downstream sides may increase, e.g., commensurate with an amount that the filter media is loaded with the dust. Suitable sensors may be implemented to detect the pressure drop level and may trigger an automated cleaning cycle or provide a notification for an operator to initiate a cleaning cycle. A cleaning cycle additionally or alternatively may be triggered based on a time interval determined by a timer, for example.

Continuing this illustrative example, to facilitate cleaning the filter media, airflow through chamber may be slowed or blocked, such as by closing a damper, deactivating a blower or other air mover, or suitable technique. Slowing or blocking airflow may cause a cessation or reduction of forces from air that may otherwise hold dust against the filter media. Reducing airflow forces that hold the dust against the filter media may facilitate other actions to dislodge the dust. A variety of systems and/or techniques can be used to dislodge the dust for cleaning the filter media. Examples may include shaking systems, pneumatic nozzles, backflow air movers, a charging system to impart or modify an electric charge for the filter media, hydraulic nozzles, and/or a vacuum tool. Dislodging the dust may allow the dust to fall toward the floor or otherwise be suitably separated from the filter media for collection and disposal. A variety of systems and/or techniques can be used to collect the dust from the floor or elsewhere. Examples may include an automated driving vehicle (e.g., with a sweeper and/or vacuum cleaner), an actuator-movable vacuum- or sweeping-tool, operator-handled devices (e.g., for sweeping and or vacuuming), a perforated floor panel through which dust can be drawn by a suction source, or a drain arranged for receiving dust collected by liquid flow. After the dust has been dislodged and collected, airflow through the chamber may be permitted anew, e.g., including flow through the newly cleaned filter media.

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Referring now to the drawings, in which like reference numerals may refer to like elements, FIG. 1 illustrates a schematic view of an example of a building 101 with a filtration system 103 according to certain embodiments. The filtration system 103 may be included within and/or interact with elements of a heating ventilation and cooling (HVAC) system 105. A filtration control system 107 may communicate with and/or control various elements to control operation of the filtration system 103. The filtration control system 107 may be an independent control system or may be in communication with- or part of-a HVAC control system 109 of the building 101.

In the illustrated embodiment, the HVAC control system 109 communicates with and/or controls elements to provide a conditioned space 111 of the building 101 with air of a certain quality (e.g., satisfying criteria related to temperature, humidity, and/or pressure). The HVAC control system 109 may control components to obtain a suitable supply of air, such as by drawing from the environment outside of the building 101 and in through an intake vent 113. The air may pass through the filtration system 103 and be routed through ducting or other suitable supply 115, for example. During operation, the HVAC control system 109 may control operation of HVAC components 117 (such as compressors, blowers, heat exchangers, etc.) to change the condition (e.g., levels of heat, moisture, and/or pressure) of air that is provided to the conditioned space 111 and/or equipment therein, such as to servers or other computing devices 119. The HVAC control system 109 may also control components to transfer exhaust air out of the conditioned space 111, such as through ducting 121 and an exhaust vent 123 into the environment outside of the building 101.

Various features of the filtration system 103 may be implemented relative to a chamber 125. The chamber 125 may correspond to a room within the building 101 and may include a ceiling, walls, and floor, for example. The chamber 125 can include an inlet 127 and an outlet 129. The inlet 127 may be arranged to receive air from the intake vent 113. The outlet 129 may be arranged for supplying air to other elements of the HVAC system 105 (e.g., via the ducting 115 toward the HVAC components 117).

Suitable structures may be included for controlling airflow through the inlet 127 and/or the outlet 129. For example, in FIG. 1, the inlet 127 and the outlet 129 are each depicted as including a respective damper 131 (e.g., respectively an inlet damper 131A and an outlet damper 131B). The damper 131 may include pivotable blades or other movable structures capable of moving between an open state (in which air flow is permitted in the chamber 125) and a closed state (in which air flow through the chamber 125 is blocked and/or prevented). Although dampers 131 are shown at both the inlet 127 and the outlet 129, the dampers 131 or other suitable airflow control features may be present at any one or more of these or other locations within the building 101 suitable for modulating airflow.

The filtration system 103 can include suitable filter media 133 for filtering air passing through the chamber 125. Examples of the filter media 133 may include bag filters or rigid filters. Rigid filters may be formed of molded material and may retain a particular shape or contour, for example. Bag filters may be collapsible and/or expandable based on airflow therethrough and/or amounts of support provided from associated support structure. The filter media 133 may be rated with a Minimum Efficiency Reporting Value (MERV) rating of MERV 13 or other suitable filtration standard, for example. The filter media 133 may be arranged in the path of airflow toward the outlet 129. For example, the filter media 133 be arranged substantially entirely across an air path so that substantially all air traveling toward the outlet 129 will pass through the filter media 133 prior to reaching the outlet 129. The filter media 133 may correspond to an individual filter structure or may include multiple filter structures. In use, the filter media 133 may be arranged to gather dust from air traveling from the inlet 127 toward the outlet 129.

The filtration system 103 can include or interact with suitable structure for facilitating cleaning of the filter media 133. For example, a dust dislodger 135 and a dust collector 137 may be utilized. The dust dislodger 135 may correspond to any dust dislodgment system and/or may include suitable means for dislodging dust accumulated in the filter media 133. Various examples are described further herein, e.g., with respect to FIGS. 2-7. In various embodiments, the dust dislodger 135 may dislodge dust such that dislodged dust is permitted to fall to the floor of the chamber 125.

The dust collector 137 may correspond to any dust collection system and/or may include suitable means for collecting and/or removing dust dislodged from the filter media 133. Various examples are described further herein, e.g., with respect to FIGS. 2-7. In various embodiments, the dust collector 137 may collect and/or remove dust from the floor of the chamber 125 for disposal.

A sensor 139 may provide pertinent information about features of the filtration system 103 and/or the HVAC system 105. For example, the filtration control system 107 can receive information from the sensor 139 and control other elements (such as a damper 131, the dust dislodger 135, and/or the dust collector 137) based on the received sensor information. The sensor 139 can include any suitable sensor or combination of sensors for gathering information such as a pressure differential between an upstream and downstream side of the filter media 133; airflow velocity into, through, and/or out of the chamber 125; air temperature outside the building 101, in the chamber 125, or elsewhere in the building; and/or any other indicator of the presence of conditions relevant to operation of the filtration system 103 and/or the HVAC system 105. Although the sensor 139 is depicted in FIG. 1 along an edge of the chamber 125, the sensor 139 may be positioned at any appropriate location for gathering relevant information, including, but not limited to, inside, outside, or remote from the chamber 125 and/or the building 101.

A timer 141 may be included and facilitate operation of the filtration control system 107 and/or the HVAC control system 109. The timer 141 may provide information about elapsed time from—or time until—a start time, stop time, or other particular milestone. In some examples, activation, deactivation, and/or other modulation of other elements (such as a damper 131, the dust dislodger 135, and/or the dust collector 137) may be based on information from the timer 141.

The filtration control system 107 and/or the HVAC control system 109 can include controllers or other computing devices, such as server computers or desktop computers, configured with various hardware and software modules to implement the processes described herein. The computing devices generally include a processor and a computer-readable storage medium or memory storing instructions that, when executed by the processor, allow the computing device to perform its intended functions. The memory generally includes RAM, ROM, and/or other persistent or non-transitory memory. In one example, a user (e.g., a datacenter administrator or a HVAC technician) may use a computing device to adjust parameters to alter a manner in which cooling systems function, such as by modifying goal temperatures, triggering events, timing, and/or other characteristics of the cooling system operation. In some embodiments, computing devices additionally or alternatively can operate automatically, without ongoing input from a user. For example, the filtration control system 107 and/or the HVAC control system 109 may automatically process information from sensors 139 and/or timer 141 and respond by controlling elements associated with the building 101.

In operation, the filtration control system 107 can perform suitable actions for facilitating operation and/or cleaning of the filtration system 103. As an example, the filtration control system 107 may determine a suitable trigger for prompting a cleaning cycle (e.g., which may include operation of the dust dislodger 135 and/or the dust collector 137). In some examples, the trigger may be based on an amount of time elapsed from starting or finishing of a previous stage of a cleaning cycle and/or based on other information from the timer 141. In some examples, the trigger may be based on conditions detected by the sensor 139. For example, the trigger may be based on a pressure differential detected between an upstream side and a downstream side of the filter media 133. The pressure differential may correlate to an amount that the filter media 133 is loaded with dust and may correlate to an amount of energy consumed in moving air across the filter media. The trigger may be based on the pressure differential being over a threshold amount. As a non-limiting example, the threshold amount may be set at a value that is less than or equal to 1 inch of water column. For example, the threshold amount may be set to equal 1 inch of water column such that any detected pressure drop over 1 inch of water column will trigger a cleaning cycle. In other examples, the threshold amount may be set to other values, such as prompting a cleaning cycle if the measured pressure drop is over 0.9 inches of water column, over 0.8 inches of water column, over 0.7 inches of water column, over 0.6 inches of water column, over 0.5 inches of water column, over 0.4 inches of water column, over 0.3 inches of water column, over 0.2 inches of water column, or over 0.1 inches of water column. As an illustrative example, the threshold value may be set to equal 0.3 inch of water column based on such value being at or near a level at which airlocks or other sealing mechanisms may be implemented to allow maintaining such a pressure difference. As another illustrative example, the threshold value may be set to equal 0.7 inch of water column on based on such value being deemed a reasonable maximum level of energy inefficiency to permit from losses across the filter media 133. As another illustrative example, the threshold value may be set to equal 1.0 inch of water column on based on such value being deemed an extreme maximum level of energy inefficiency to permit from losses across the filter media 133.

In some embodiments, the filtration control system 107 may send a signal to prompt a cleaning cycle, and the signal may trigger automated operation of the dust dislodger 135 and/or the dust collector 137. In some embodiments, a signal additionally or alternatively may be provided to user interface 143 to alert a user to activate the dust dislodger 135 and/or the dust collector 137. As non-limiting examples, the user interface 143 may include a screen, an indicator light, a speaker, or other device capable of communicating to a user regarding readiness or suitability of performing actions for a cleaning cycle.

Elements may be suitably controlled for performing a cleaning cycle. In some embodiments, airflow is reduced and/or stopped within the chamber 125 prior to and/or during operation of the dust dislodger 135, and/or the dust collector 137. For example, reducing or stopping airflow may be achieved by switching a damper 131 from open to closed, by controlling a blower or other part of an HVAC component 117 to turn off or turn down, or by any other suitable technique. Reducing or stopping airflow may reduce a force with which dust is pressed against the filter media 133 and thus permit the dust dislodger 135 to more easily dislodge dust from the filter media 133. Reducing or stopping airflow additionally or alternatively may avoid exertion of forces on falling dust that could otherwise pull the dust back toward the filter media 133 and/or away from the floor or other location where the dust is to be collected by the dust collector 137. Upon completion of the cleaning cycle, airflow through the chamber 125 may be reestablished or permitted anew.

Figure 2:
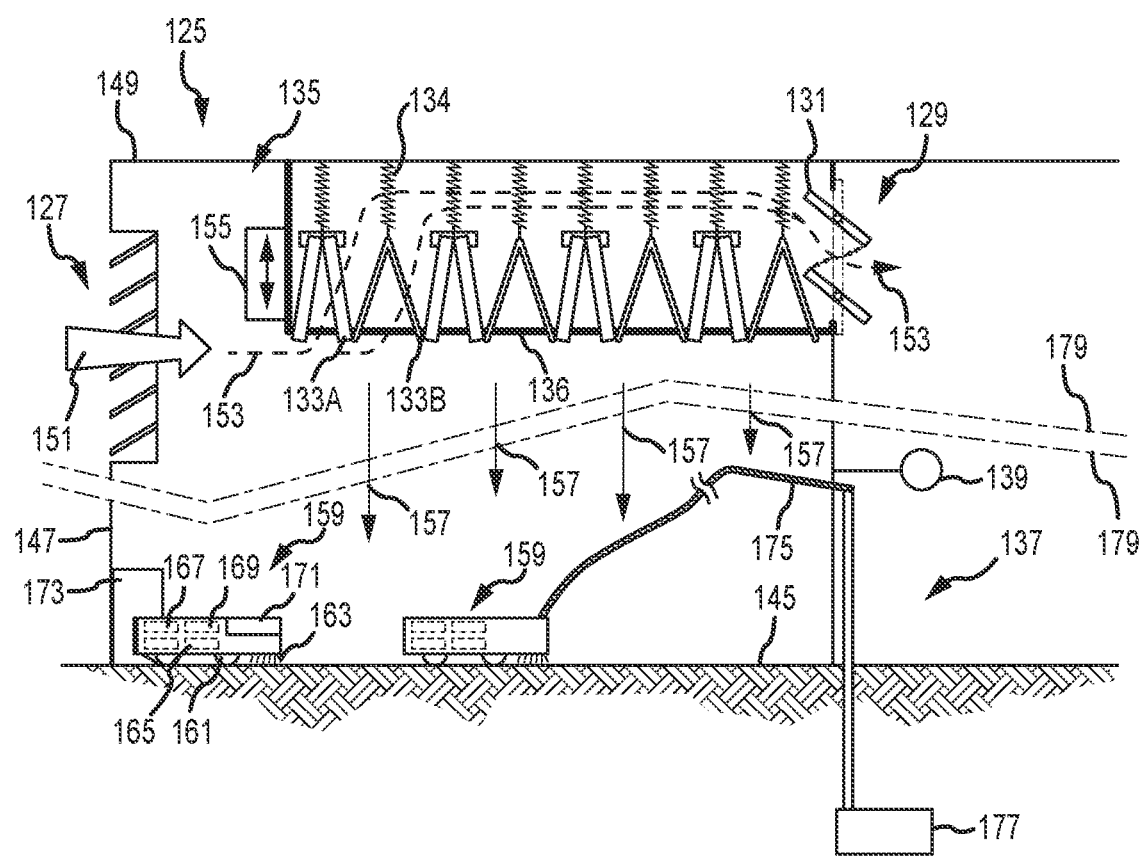
FIG. 2 illustrates examples of elements (such as one or more autonomous driving vehicles and/or a shaking system) that may be utilized individually or collectively in a filtration chamber of the building of FIG. 1 according to certain embodiments.

FIG. 2 illustrates an example of the chamber 125 with examples of elements that may be utilized individually or collectively therein. The chamber 125 can be defined by a room within the building 101. For example, the chamber 125 can include a floor 145, walls 147, and a ceiling 149. The floor 145 may be flat or planar. For example, the floor may be arranged substantially along a horizontal plane arranged perpendicular to a direction of gravity, although some variation therefrom may be implemented (such as to impart a sufficient slope to permit running of liquid as described by with respect to FIG. 6B, for example, and/or to facilitate other functions). The inlet 127 in FIG. 2 is shown in the wall 147 as a louvered opening and the outlet 129 is shown with a damper 131, although other air control structures and/or arrangements may be utilized, such as, but not limited to, those described with respect to FIG. 1.

The filter media 133 is shown with alternating instances of bag filters 133A and rigid filters 133B by way of example in FIG. 2, although the filter media 133 can be any combination of mixed or homogenous sets of filter types or varieties. For simplicity, subsequent figures show solely bag filters 133B but could include rigid filters 133B and/or other types of filter media 133 additionally or alternatively. The filter media 133 may be suspended or otherwise supported by springs 134 or other suitable members that may maintain the filter media 133 in suitable position and/or allow suitable amounts of deflection of the filter media 133 in use. Additionally or alternatively, a frame 136 may at least partially support the filter media 133, such as by being arranged along openings defined for air to flow through the filter media 133. For example, the frame may extend at least partially around perimeters of openings defined by the filter media 133 without completely obstructing airflow through the filter media 133.

An example of airflow is depicted in FIG. 2. In the depicted example, air can enter through the inlet 127 (e.g., as illustrated by arrow 151). Air may flow through the filter media 133 and out the outlet 129 (e.g., as illustrated by arrows 153). In the course of passing through the filter media 133, dust from the air may be captured in the filter media 133. Dust may load the filter media 133. The sensor 139 may register a corresponding pressure differential between upstream and downstream of the filter media 133 (e.g., which may trigger a cleaning cycle) Airflow may be stopped or reduced (e.g., by damper 131) prior to operation of the dust dislodger 135 and the dust collector 137, and airflow additionally or alternatively may be permitted before, after, and/or independently of operation of the dust dislodger 135 and the dust collector 137.

An example of the dust dislodger 135 is depicted in FIG. 2. The dust dislodger 135 may include a shaking system 155. The shaking system 155 may include a motor, a reciprocating actuator, or any other structure capable of imparting a shaking motion to the filter media 133 for dislodging dust from the filter media 133. Although the shaking system 155 is depicted schematically as coupled with the frame 136, the shaking system 155 may be coupled with the springs 134 or any other suitable component for transmitting shaking motion to the filter media 133. Additionally, although the shaking system 155 is depicted as located laterally adjacent to the frame 136, the shaking system 155 may be located above the filter media 133 and/or in another suitable location.

Dust dislodged from the filter media 133 may fall downward, such as depicted by arrows 157. The dust may fall toward the floor 145, for example. The floor 145 may provide a suitable surface from which the dust can be collected and/or disposed of by the dust collector 137.

An example of the dust collector 137 is also depicted in FIG. 2. The dust collector 137 may include one or more automated driving vehicles 159. The automated driving vehicle 159 may be capable of travelling autonomously throughout the chamber 125 and/or other space without an onboard operator or driver, for example. The automated driving vehicle 159 can include wheels and/or other elements of a propulsion system 161. The automated driving vehicle 159 may include bristles, rollers, and/or other form of sweeper 163 capable of moving dust accumulated on the floor 145. The automated driving vehicle 159 additionally or alternatively may include a vacuum cleaner 165 that may be capable of collecting dust from the floor 145. For example, the sweeper 163 if present may direct dust into a zone to be captured by the vacuum cleaner 165, and/or the vacuum cleaner 165 may directly collect dust from the floor 145.

The automated driving vehicle 159 may include a controller 167 capable of controlling other components of the automated driving vehicle 159. For example, the controller 167 may control the propulsion system 161 to determine a path of the automated driving vehicle, and/or may control activation and/or deactivation of the sweeper 163 and/or the vacuum cleaner 165.

The automated driving vehicle 159 may include a communication module 169. The communications module 169 may permit sending and/or receiving communication relative to the automated driving vehicle 159. For example, the communications module 169 may allow communication from the filtration control system 107 for instructions when to activate or deactivate and/or what route to follow.

The automated driving vehicle 159 may include a receptacle 171. Dust may be collected into the receptacle 171, e.g., in response to operation of the sweeper 163 and/or the vacuum cleaner 165.

The automated driving vehicle 159 may be capable of docking with or otherwise interacting with a station 173. The station 173 may include suitable infrastructure for emptying the receptacle 171, for example. The station 173 additionally or alternatively may provide infrastructure for charging a battery, fuel, or other power source of the automated driving vehicle 159.

In some examples, the automated driving vehicle 159 may be equipped with a hose or other conduit 175 for offloading dust collected by the automated driving vehicle 159. For example, the conduit 175 may be coupled with a centralized vacuum system 177, e.g., which may include a suction source and/or a suitable repository for disposal of the collected dust.

Although particular examples of the dust dislodger 135 and the dust collector 137 are shown in FIG. 2, the particular examples are not limited to use with one another. For ease of reference, break lines 179 are illustrated in FIG. 2, with the particular example of the dust dislodger 135 shown above the break lines 179 and with the particular example of the dust collector 137 shown below the break lines 179. Other examples are represented in FIG. 3A through FIG. 7 relative to similar break lines 179, and it is to be understood accordingly that any possible example of the dust dislodger 135 may be utilized with any possible example of the dust collector 137 (e.g., any option from above the break line 179 may be used with any option from below the break line 179).

Figure 3A:
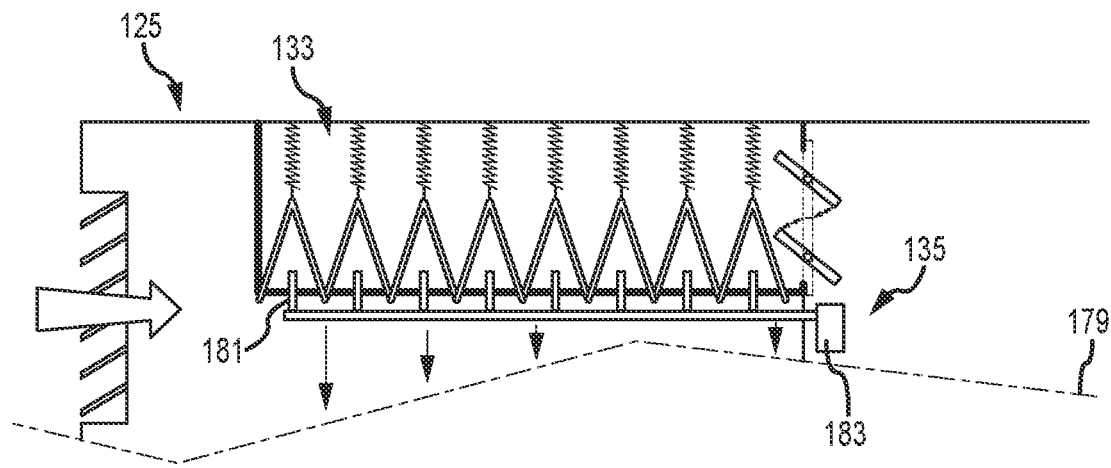
FIG. 3A illustrates an example of a pneumatic nozzle that may be utilized in a filtration chamber of the building of FIG. 1 according to certain embodiments.

FIG. 3A illustrates another example of the dust dislodger 135 that may be utilized in the chamber 125. The dust dislodger 135 may include a pneumatic system, which can include one or more pneumatic nozzles 181. The pneumatic nozzle 181 may be positioned for directing air or other gas flow toward the filter media 133. The pneumatic nozzle 181 may provide jets, streams, bursts, or sprays of air or gas, for example. Flow may be provided from the pneumatic nozzle 181 with sufficient velocity and/or force for dislodging dust from the filter media 133 and allowing the dislodged dust to fall (e.g., as illustrated by the arrows in FIG. 3A). The pneumatic nozzle 181 may be communicatively coupled via piping or other suitable conduit and/or network to a gas source 183. The gas source 183 may include a pump, a connection to a pressurized gas network, and/or other structure suitable for providing pressurized gas.

Figure 3B:
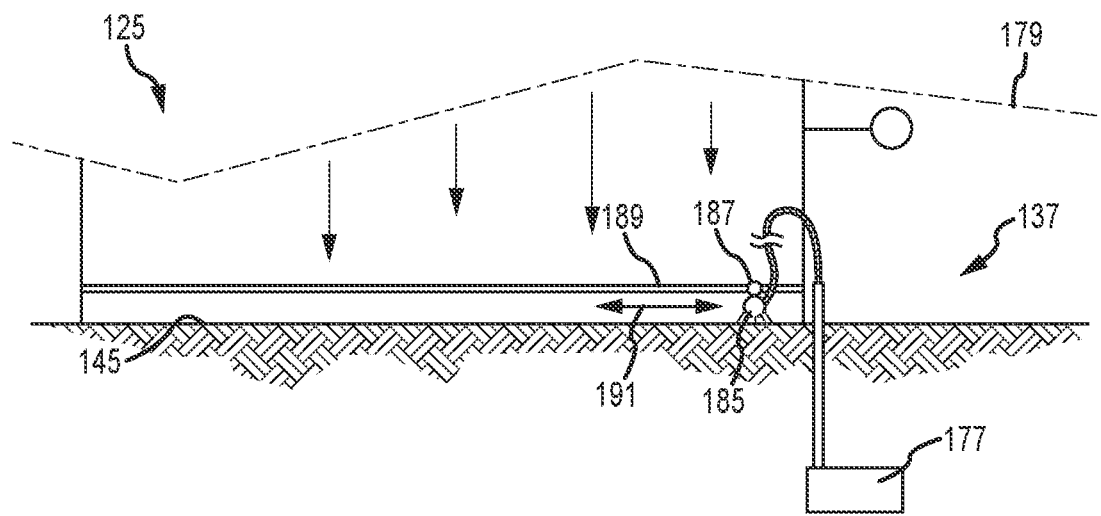
FIG. 3B illustrates an example of a tool and corresponding actuator that may be utilized in a filtration chamber of the building of FIG. 1 according to certain embodiments.

FIG. 3B illustrates another example of the dust collector 137 that may be utilized in the chamber 125. The dust collector 137 may include a tool 185 moveable by an actuator 187. Although the tool 185 is shown as a tube having perforations through which suction can be applied to collect dust (as a result of connection to a centralized vacuum system 177, for example), any other suitable structure of a vacuum tool may be utilized. Additionally or alternatively, the tool 185 may include bristles for pushing and/or pulling dust (e.g., toward perforations or other suction openings in the tool 185 and/or toward another receptacle or system for disposing of collected dust). The actuator 187 may move the tool 185, for example, along the floor 145 of the chamber 125 (e.g., where dust may have accumulated after falling, as illustrated by the arrows in FIG. 3B). As an example, the actuator 187 is shown as a carriage that can be moved along a rail 189 to cause the tool 185 to move along an axis (e.g., as shown by arrow 191), although the actuator 187 may include any other suitable actuator (e.g., linear actuator or rotational actuator) capable of moving the tool 185 for dust collection.

Figure 4A:
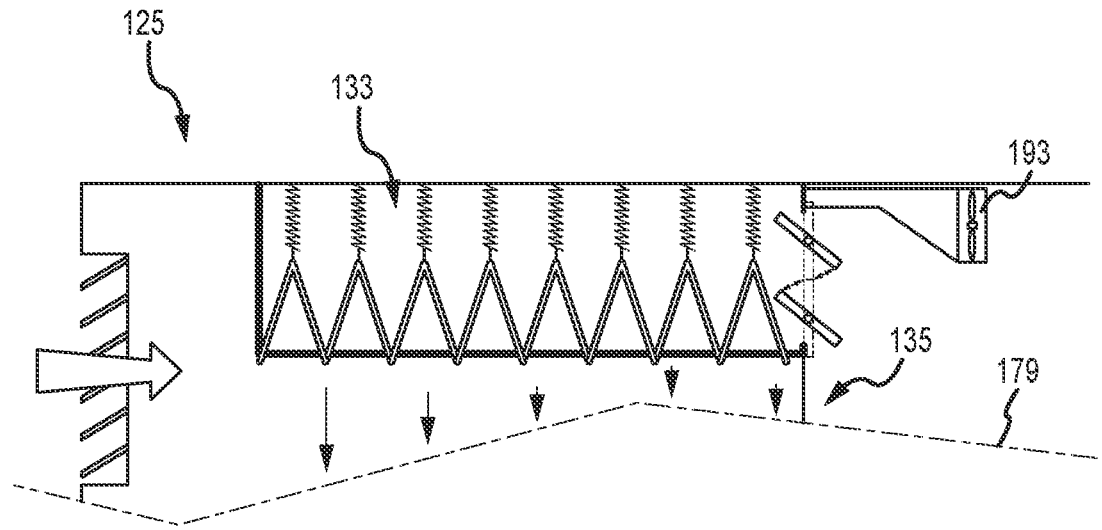
FIG. 4A illustrates an example of a backflow air mover that may be utilized in a filtration chamber of the building of FIG. 1 according to certain embodiments.

FIG. 4A illustrates another example of the dust dislodger 135 that may be utilized in the chamber 125. The dust dislodger 135 may include an air mover 193. The air mover 193 may correspond to a fan, a blower, or another suitable structure for moving air or gas. The air mover 193 may be arranged to push air or other gas across the filter media 133 in a backflow direction, such as in a direction away from the outlet and/or toward the inlet of the chamber 125. Back flow may be provided from the air mover 193 with sufficient velocity and/or force for dislodging dust from the filter media 133 and allowing the dislodged dust to fall (e.g., as illustrated by the arrows in FIG. 4A).

Figure 4B:
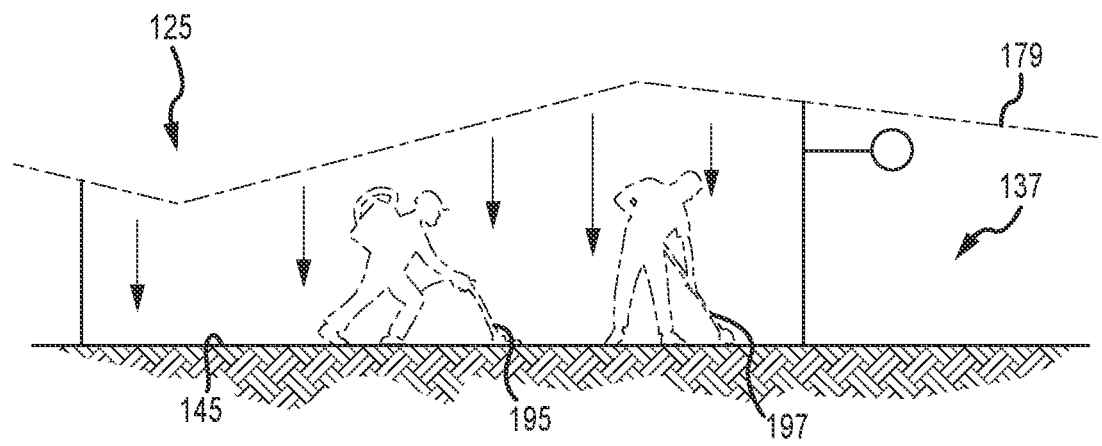
FIG. 4B illustrates examples of operator-handled tools (such as a vacuum cleaner and/or sweeper) that may be utilized in a filtration chamber of the building of FIG. 1 according to certain embodiments.

FIG. 4B illustrates another example of the dust collector 137 that may be utilized in the chamber 125. The dust collector 137 may include operator-handled tools. The operator-handled tools may include tools configured to be borne or brandished by an operator. As examples, FIG. 4B shows a vacuum cleaner 195 and a broom or other sweeper 197 that may be carried, pushed, pulled, and/or otherwise utilized by an operator that has entered the chamber 125 for conducting the portion of the cleaning cycle corresponding to dust collection. The dust may be collected from along the floor 145 of the chamber 125 (e.g., where dust may have accumulated after falling, as illustrated by the arrows in FIG. 4B).

Figure 5A:
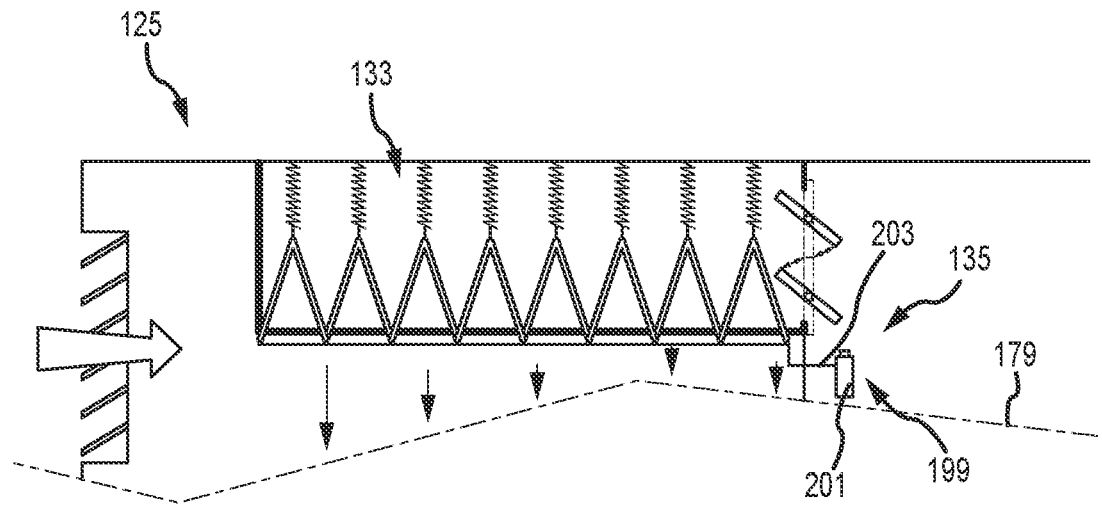
FIG. 5A illustrates an example of a charging system that may be utilized in a filtration chamber of the building of FIG. 1 according to certain embodiments.

FIG. 5A illustrates another example of the dust dislodger 135 that may be utilized in the chamber 125. The dust dislodger 135 may include a charging system 199, which can include one or more charging sources 201. The charging source 201 may include a battery, connection to an electrical utility grid, and/or any other suitable power source. The charging source 201 may utilize power to provide, impart, or modify a charge for the filter media 133, such as through suitable conductors 203. For example, the charging source 201 may alter a polarity or otherwise affect a charge (e.g., similar to static electricity) that may drive dust away from the filter media 133. The charging source 201 may provide a suitable charge for dislodging dust from the filter media 133 and allowing the dislodged dust to fall (e.g., as illustrated by the arrows in FIG. 5A).

Figure 5B:
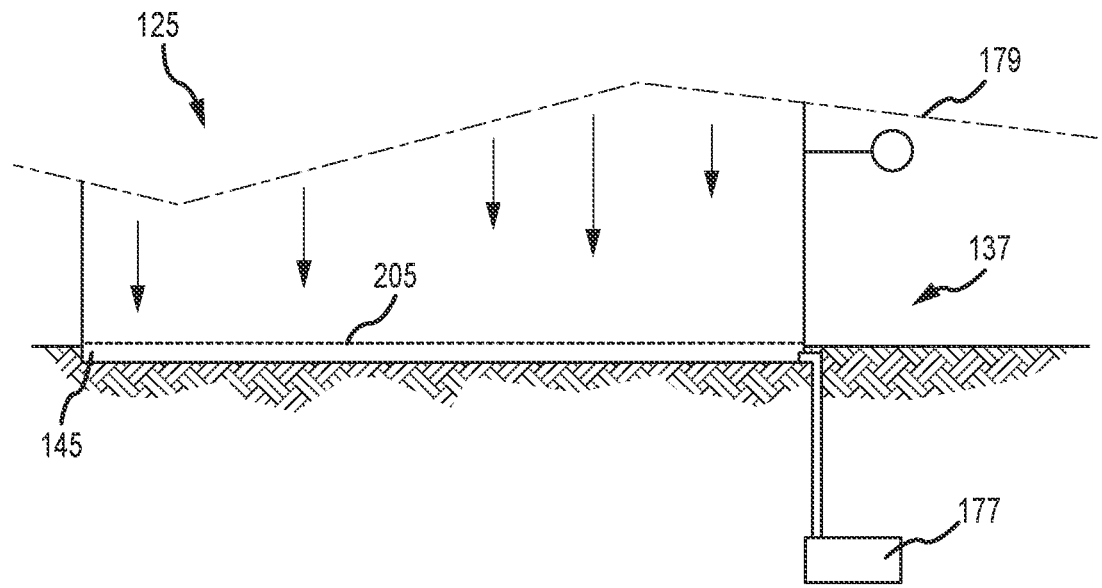
FIG. 5B illustrates an example of a perforated panel that may be utilized in a filtration chamber of the building of FIG. 1 according to certain embodiments.

FIG. 5B illustrates another example of the dust collector 137 that may be utilized in the chamber 125. The dust collector 137 may include a perforated panel 205 incorporated into or positioned over the floor 145 of the chamber 125. The perforated panel 205 may include apertures through which dust can be drawn. For example, the dust may be drawn in response to a centralized vacuum system 177 or other suitable suction source. The dust may be collected from along the floor 145 of the chamber 125 (e.g., where dust may have accumulated after falling, as illustrated by the arrows in FIG. 5B).

Figure 6A:
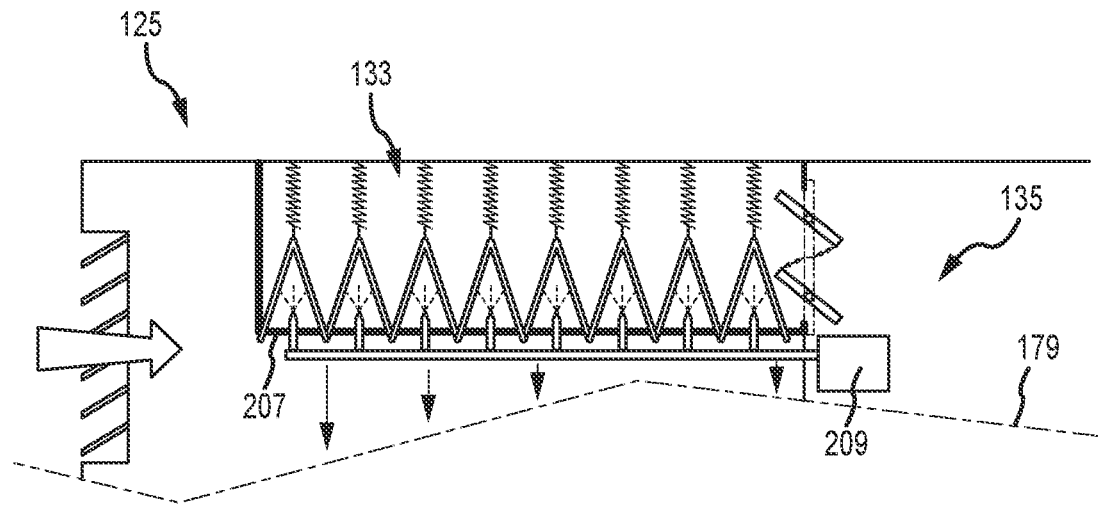
FIG. 6A illustrates an example of a hydraulic nozzle that may be utilized in a filtration chamber of the building of FIG. 1 according to certain embodiments.

FIG. 6A illustrates another example of the dust dislodger 135 that may be utilized in the chamber 125. The dust dislodger 135 may include a hydraulic system, which can include one or more hydraulic nozzles 207. The hydraulic nozzle 207 may be positioned for directing water or other liquid flow toward the filter media 133. The hydraulic nozzle 207 may provide jets, streams, bursts, or sprays of water or other liquid toward the filter media 133. Flow may be provided from the hydraulic nozzle 207 in sufficient force for dislodging dust and/or in sufficient quantity for capturing dust within the liquid, such that the dislodged dust may fall (e.g., within the liquid and/or as illustrated by the arrows in FIG. 6A). The hydraulic nozzle 207 may be communicatively coupled via piping or other suitable conduit and/or network to a liquid source 209. The liquid source 209 may include a pump, a connection to a water utility network or other fluid network, and/or other structure suitable for providing pressurized liquid.

Figure 6B:
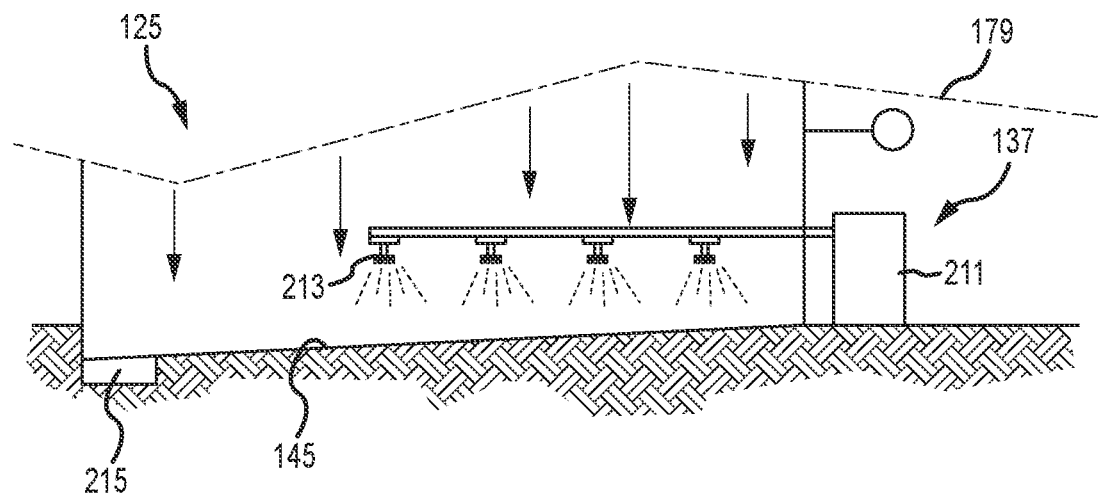
FIG. 6B illustrates an example of a drain that may be utilized in a filtration chamber of the building of FIG. 1 according to certain embodiments.

FIG. 6B illustrates another example of the dust collector 137 that may be utilized in the chamber 125. The dust collector 137 in FIG. 6B is shown with a sprinkler 213, a liquid source 211, and a drain 215, although other combinations may be utilized. The dust may be collected from along the floor 145 of the chamber 125 (e.g., where dust may have accumulated after falling, as illustrated by the arrows in FIG. 6B). The sprinkler 213 may be positioned for directing water or other liquid flow toward the floor 145 or other surface on which dust may have accumulated after being dislodged from the filter media 133. The liquid source 211 may correspond to a pump, a connection to a water utility network or other fluid network, and/or other structure suitable for supplying liquid to the sprinkler 213. The liquid source 211 may be the same or different from the liquid source 209 described above with respect to FIG. 6A.

In use, water or other liquid from the sprinkler 213 may run along the floor 145 toward the drain 215. Additionally or alternatively, the drain 215 may receive water or other liquid that may have originated from the hydraulic nozzles 207 discussed above with respect to FIG. 6A (e.g., which may include dust dislodged from the filter media 133). The floor 145 may be sloped toward the drain 215 to facilitate movement of water or other liquid toward the drain for disposal of dust collected within the water or other liquid.

Figure 7:
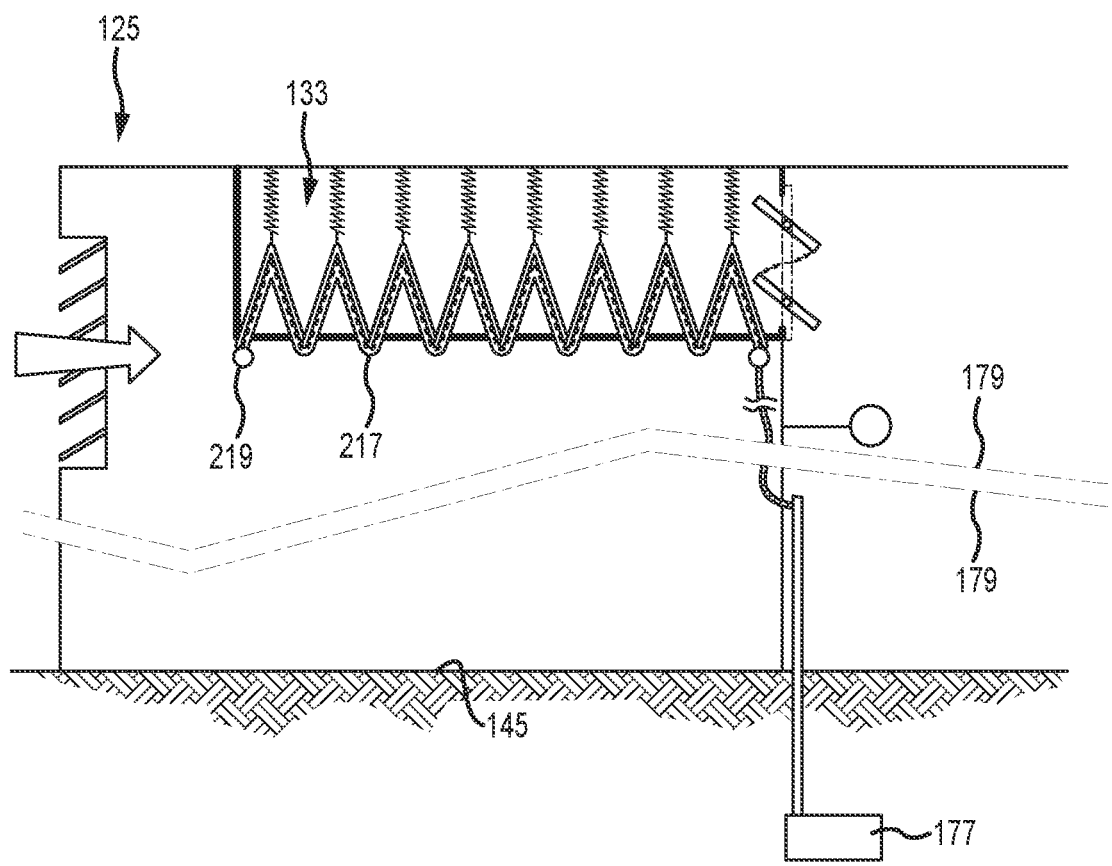
FIG. 7 illustrates an example of a tool movable along filter media and that may be utilized in a filtration chamber of the building of FIG. 1 according to certain embodiments.

FIG. 7 illustrates another example of the dust dislodger 135 and/or the dust collector 137 that may be utilized in the chamber 125. In FIG. 7, a tool 217 is depicted. The tool 217 may correspond to a structure shaped to follow a contour or profile of the filter media 133. The tool 217 may be coupled with an actuator 219 for movement of the tool along the filter media 133 (e.g., in contact with or proximate to a surface of the filter media 133). The actuator 219 may move the tool 217 in a direction corresponding to into and/or out of the page in the view shown in FIG. 7. The actuator 219 may include or interact with rails or other suitable structure for guiding and/or supporting the tool 217 in use.

The tool 217 may include similar structure to that described above for the tool 185 with respect to FIG. 3B. As examples, the tool 217 in FIG. 7 is shown as a shaped tube having perforations through which suction can be applied to collect dust (as a result of connection to a centralized vacuum system 177, for example), although any other suitable structure of a vacuum tool may be utilized. Additionally or alternatively, the tool 217 may include bristles for pushing and/or pulling dust from the filter media 133 (e.g., toward perforations or other suction openings in the tool 217 and/or toward another receptacle or system for disposing of collected dust).

The dust dislodger 135 and the dust collector 137 may correspond to a combined system, e.g., such that the tool 217 performs both functions of dislodging and collecting dust from the filter media 133. In some embodiments, the tool 217 may sweep, brush, scrape, pull, push, or otherwise dislodge dust from the filter media 133 without also collecting. For example, the tool 217 may form part of the dust dislodger 135 and may be utilized with another structure of the dust collector 137 described herein.

Based on the disclosure and teachings provided herein, a person of ordinary skill in the art will appreciate other ways and/or methods to implement the various embodiments. The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Various embodiments of this disclosure are described herein, including the best mode known to the inventors for carrying out the disclosure. Variations of those embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A datacenter comprising:
   a building;
   a conditioned space within the building and containing computing devices;
   a heating, ventilation, and air conditioning system (HVAC system), the HVAC system configured to provide air of a certain temperature to the conditioned space; and
   a filtration system comprising:
      a room defining a chamber within the building and having a ceiling, walls, and a floor;
      an inlet into the room for receiving air from an environment outside of the building;
      an outlet from the room for supplying air from the room to the HVAC system;
      filter media arranged to gather dust out of air traveling from the inlet toward the outlet;
      a dust dislodgment system arranged to dislodge dust accumulated in the filter media such that dislodged dust is permitted to fall to the floor; and
      a dust collection system arranged to collect dust dislodged by the dust dislodgment system, the dust collection system comprising an automated driving vehicle comprising a vacuum cleaner or sweeper, the vacuum cleaner or sweeper configured for collecting dust from the floor for disposal.

2. The datacenter of claim 1, further comprising a damper configurable between:
   an open configuration in which air flow is permitted through the chamber; and
   a closed configuration in which air flow through the chamber is blocked or prevented, wherein the filter media is configured to collect dust when the damper is in the open configuration, wherein the dust dislodgment system is configured to dislodge dust when the damper is in the closed configuration, and wherein the dust collection system is configured to collect dust when the damper is in the closed configuration.

3. The datacenter of claim 1, wherein the filtration system further comprises
   a sensor configured for detection of a pressure differential between an upstream side and a downstream side of the filter media; and
   a controller configured to send a signal to prompt operation of the dust dislodgment system and the dust collection system, wherein the controller is configured to send the signal in response to detection by the sensor of a pressure differential being over a threshold, wherein the threshold is set at a value that is less than 0.7 inches of water column.

4. The datacenter of claim 1, wherein the filter media comprises at least one bag filter or at least one rigid filter.

5. A filtration system comprising:
   a frame;
   filter media mounted in the frame in an installed position arranged to accumulate dust out of air traveling in an airflow path between an inlet and an outlet each configured for air flow therethrough for provision of filtered air through the outlet toward a conditioned space remote from the frame;
   a dust dislodgment system arranged to dislodge dust accumulated in the filter media such that dislodged dust is permitted to fall downward; and
   means for removing dislodged dust from a floor below the frame for disposal.

6. The filtration system of claim 5, further comprising a controller configured to cause a filtration cycle which includes activation and deactivation of each of the dust dislodgment system and the means for removing dislodged dust.

7. The filtration system of claim 6, wherein the controller is configured to cause the filtration cycle in response to input from a sensor about a pressure differential between an upstream side and a downstream side of the filter media.

8. The filtration system of claim 6, wherein the controller is configured to cause the filtration cycle in response to a timer.

9. The filtration system of claim 5, wherein the dust dislodgment system comprises:
   a shaking system configured to shake the filter media;
   a pneumatic nozzle positionable to direct gas flow toward the filter media;
   a backflow air mover arranged to push air across the filter media in a direction away from the outlet;
   a charging system configured to impart or modify an electric charge for the filter media;
   a hydraulic nozzle positionable to direct liquid flow toward the filter media; or
   a tool coupled with an actuator arranged to move the tool along the filter media.

10. The filtration system of claim 5, wherein the means for removing dislodged dust comprises:
    an automated driving vehicle comprising a vacuum cleaner or sweeper;
    a tool comprising at least one of a vacuum tool or a sweeping tool and coupled with an actuator arranged to move the tool along the floor;
    a vacuum cleaner or sweeper configured to be borne or brandished by an operator;
    a perforated panel incorporated into or positioned over the floor and having apertures through which dust can be drawn in response to a suction source; or
    a drain arranged to receive dust collected by liquid flow.

11. The filtration system of claim 5, wherein the filtration system is configured for providing air to a heating, ventilation, and air conditioning system configured to provide air of a certain temperature to a conditioned space that contains computing devices within a datacenter building.

12. The filtration system of claim 5, further comprising:
    a sensor configured for detection of a pressure differential between an upstream side and a downstream side of the filter media; and
    a controller configured to send a signal to prompt operation of the dust dislodgment system and the means for removing dislodged dust, wherein the controller is configured to send the signal in response to detection by the sensor of a pressure differential being over a threshold, wherein the threshold is set at a value that is less than 0.7 inches of water column.

13. A filtration system comprising:
    a chamber having an inlet and an outlet each configured for air flow therethrough;
    filter media arranged in an installed position arranged to accumulate dust out of air traveling in an airflow path between the inlet and the outlet for provision of filtered air through the outlet toward a conditioned space remote from the chamber;
    a dust dislodgment system arranged to dislodge dust accumulated in the filter media such that dislodged dust is permitted to fall downward;
    a dust collection system arranged to collect dust dislodged by the dust dislodgement system along a floor of the chamber;
    a sensor configured for detection of a pressure differential between an upstream side and a downstream side of the filter media; and
    a controller configured to send a signal to prompt operation of the dust dislodgment system and the dust collection system, wherein the controller is configured to send the signal in response to detection by the sensor of a pressure differential being over a threshold, wherein the threshold is set at a value that is less than 0.7 inches of water column.

14. The filtration system of claim 13, wherein the signal to prompt operation comprises a signal to the dust dislodgment system and the dust collection system for automated activation.

15. The filtration system of claim 13, wherein the signal to prompt operation comprises a signal to a user interface to alert a user to activate at least one of the dust dislodgment system or the dust collection system.

16. The filtration system of claim 13, wherein the chamber defines walls and the floor, and wherein the dust collection system is arranged to collect dislodged dust along the floor for disposal.

17. The filtration system of claim 13, wherein the dust dislodgment system comprises:
    a shaking system configured to shake the filter media;
    a pneumatic nozzle positionable to direct gas flow toward the filter media;
    a backflow air mover arranged to push air across the filter media in a direction away from the outlet;
    a charging system configured to impart or modify an electric charge for the filter media;
    a hydraulic nozzle positionable to direct liquid flow toward the filter media; or
    a tool coupled with an actuator arranged to move the tool along the filter media.

18. The filtration system of claim 13, wherein the dust collection system comprises:
    an automated driving vehicle comprising a vacuum cleaner or sweeper;
    a tool comprising at least one of a vacuum tool or a sweeping tool and coupled with an actuator arranged to move the tool along the floor of the chamber;
    a vacuum cleaner or sweeper configured to be borne or brandished by an operator;
    a perforated panel incorporated into or positioned over the floor of the chamber and having apertures through which dust can be drawn in response to a suction source;
    a drain arranged to receive dust collected by liquid flow; or
    a tool coupled with an actuator arranged to move the tool along the filter media.

19. The filtration system of claim 13, wherein the dust dislodgment system and the dust collection system are a combined system that comprises a vacuum tool coupled with an actuator arranged to move the vacuum tool along the filter media.

20. The filtration system of claim 13, wherein the filtration system is configured for providing air to a heating, ventilation, and air conditioning system configured to provide air of a certain temperature to a conditioned space that contains computing devices within a datacenter building.

* * * * *